United States Patent
O'Sullivan et al.

(10) Patent No.: US 9,935,092 B2
(45) Date of Patent: Apr. 3, 2018

(54) RADIO FREQUENCY TRANSISTOR STACK WITH IMPROVED LINEARITY

(71) Applicants: John Anthony O'Sullivan, Cork City (IE); John Keane, Co. Cork (IE)

(72) Inventors: John Anthony O'Sullivan, Cork City (IE); John Keane, Co. Cork (IE)

(73) Assignee: Ferfics Limited (IE)

( * ) Notice: Subject to any disclaimer, the term of this patent is extended or adjusted under 35 U.S.C. 154(b) by 0 days.

(21) Appl. No.: 14/745,051

(22) Filed: Jun. 19, 2015

(65) Prior Publication Data
US 2016/0005729 A1    Jan. 7, 2016

Related U.S. Application Data

(60) Provisional application No. 62/020,568, filed on Jul. 3, 2014.

(51) Int. Cl.
| | | |
|---|---|---|
| *H01L 29/66* | (2006.01) | |
| *H01L 27/02* | (2006.01) | |
| *H01L 27/088* | (2006.01) | |
| *H01L 29/417* | (2006.01) | |
| *H01L 27/092* | (2006.01) | |

(52) U.S. Cl.
CPC ........ *H01L 27/0207* (2013.01); *H01L 27/088* (2013.01); *H01L 27/092* (2013.01); *H01L 29/41758* (2013.01)

(58) Field of Classification Search
CPC ............... H01L 27/0207; H01L 27/105; H01L 29/4238; H01L 23/528; H01L 21/768
See application file for complete search history.

(56) References Cited

U.S. PATENT DOCUMENTS

| | | | | |
|---|---|---|---|---|
| 5,166,902 | A * | 11/1992 | Silver ................ | H01L 27/1104 257/353 |
| 2003/0099210 | A1* | 5/2003 | O'Toole .............. | H03L 7/0995 370/311 |
| 2005/0270083 | A1* | 12/2005 | Nakatsuka .......... | H01L 27/0207 327/430 |
| 2012/0112832 | A1* | 5/2012 | Kawano ............ | H03F 3/72 330/124 D |
| 2013/0082242 | A1* | 4/2013 | Han .................. | H01L 29/42384 257/29 |
| 2014/0242760 | A1* | 8/2014 | Carroll ............... | H01L 21/84 438/155 |

* cited by examiner

*Primary Examiner* — A. Sefer
(74) *Attorney, Agent, or Firm* — Tarolli, Sundheim, Covell & Tummino LLP

(57) ABSTRACT

A RF transistor stack is described. The RF transistor stack comprises a first transistor having a T-gate layout configuration. The first transistor has a body region; a plurality of drain regions; and a plurality of source regions. A second transistor is provided which has a T-gate layout configuration. The second transistor has a body region; a plurality of drain regions; and a plurality of source regions. An interconnect operably couples the source regions of the first transistor with the source regions of the second transistor such that the distortion due to asymmetry in the division of RF voltage between the drain to source and the source to body terminals of first transistor is cancelled by reversing the asymmetry in the division of the RF voltage in the second transistor.

11 Claims, 12 Drawing Sheets

RADIO FREQUENCY TRANSISTOR STACK WITH IMPROVED LINEARITY

RELATED APPLICATIONS

This application claims priority from U.S. Provisional Patent Application Ser. No. 62/020,568, filed 3 Jul. 2014, which is incorporated herein in its entirety.

FIELD OF THE INVENTION

The present teaching relates to a Radio Frequency (RF) transistor stack with improved linearity.

BACKGROUND

RF switches are a key building block in wireless systems and find many uses in applications such as mobile phones and wireless LANs. The act of switching radio frequency signals in an integrated circuit is carried out by an RF switch circuit. Many technologies exist for the design of integrated RF switch circuits.

An RF switch may comprise multiple switching elements which control the flow of RF power between different points in the particular application. Switching elements are comprised of transistors that are stacked. The number of transistors in a stack is determined by the maximum RF voltage that can be developed across the complete stack and the maximum voltage that can be tolerated across an individual transistor without introducing limitations to either reliability or linearity performance of a device. RF integrated circuits (ICs) are subject to stringent linearity specifications which require tight limits on the level of distortion that a device can introduce on an RF signal. Linearity requirements may be expressed by specifying different parameters such as harmonics generation, intermodulation distortion (IMD2, IMD3) or intercept points, (IP2, IP3). Irrespective of how requirements are specified the linearity performance is determined by distortion introduced on the RF signal by RF transistor stacks. Adoption of 4G/LTE standards places ever increasing demands on linearity requirements of components such as RF switches. The RF transistor stack is becoming a limitation in achieving the required linearity performance on SOI CMOS process that must be overcome.

There is therefore a need to provide an RF transistor stack which addresses at least some of the drawbacks of the prior art.

SUMMARY

These and other problems are addressed by providing an RF transistor stack as detailed in claim 1. Advantageous embodiments are detailed in the subsidiary claims. The present disclosure describes circuit and physical design techniques that reduce sources of distortion in the RF transistor stack thereby enabling a higher level of linearity performance.

In one aspect there is provided an RF transistor stack comprising a first transistor having a T-gate layout configuration; the first transistor having a body region; a plurality of drain regions; and a plurality of source regions, a second transistor having a T-gate layout configuration; the second transistor having a body region; a plurality of drain regions; a plurality of source regions, and an interconnect operably coupling the source regions of the first transistor with the drain regions of the second transistor; wherein the distortion due to asymmetry in the division of RF voltage between the drain to body and the source to body terminals of first transistor is cancelled by reversing the asymmetry in the division of the RF voltage in second transistor.

In another aspect, the orientation of the second transistor is a reverse of the orientation of the first transistor.

In a further aspect, the first and second transistors are arranged in the stack such that the first and second transistors have a 180° opposite orientation.

In one exemplary arrangement, the interconnect between the first and second transistors is orthogonal to respective conductive layers providing gate and body bias to the first and second transistors.

In another aspect, the interconnect does not extend over at least one of the body and gates regions of the first and second transistors.

In a further aspect, the reversal of asymmetry in the RF voltage is achieved by reversing the asymmetry of the parasitic layout capacitances. Advantageously, the reversal of asymmetry in the RF voltage is achieved by reversing the asymmetry of the parasitic layout capacitances Cdb, Cbs and by reversing the asymmetry of the layout capacitances Cdg, Cgs.

In one aspect, where the interconnect crosses the horizontal is reversed with respect to the direction of the RF signal flow between first and second transistors.

In a further aspect, the first transistor has an associated lateral isolation.

In another aspect, the second transistor has an associated lateral isolation.

In one arrangement, the first transistor and the second transistor are separate transistors which are operably coupled together during fabrication of the stack.

In one aspect, two or more transistors are provided in the stack.

The present disclosure also relates to a semiconductor substrate having an RF transistor stack fabricated thereon, wherein the RF transistor stack comprises: a first transistor having a T-gate layout configuration; the first transistor having a body region; a plurality of drain regions; and a plurality of source regions, a second transistor having a T-gate layout configuration; the second transistor having a body region; a plurality of drain regions; a plurality of source regions, and an interconnect operably coupling the source regions of the first transistor with the drain regions of the second transistor such that the distortion due to asymmetry in the division of RF voltage between the drain to body and the source to body terminals of first transistor is cancelled by reversing the asymmetry in the division of the RF voltage in second transistor.

Additionally the present disclosure relates to a method of fabricating an RF transistor stack, the method comprising: providing a first transistor having a T-gate layout configuration; the first transistor having a body region; a plurality of drain regions; and a plurality of source regions, providing a second transistor having a T-gate layout configuration; the second transistor having a body region; a plurality of drain regions; a plurality of source regions, and providing an interconnect operably coupling the source regions of the first transistor with the drain regions of the second transistor such that the distortion due to asymmetry in the division of RF voltage between the drain to body and the source to body terminals of first transistor is cancelled by reversing the asymmetry in the division of the RF voltage in second transistor.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

The present teaching will now be described with reference to some exemplary RF transistor stacks. It will be understood that the exemplary RF transistor stacks are provided to assist in an understanding of the present teaching and are not to be construed as limiting in any fashion. Furthermore, circuit elements or components that are described with reference to any one Figure may be interchanged with those of other Figures or other equivalent circuit elements without departing from the spirit of the present teaching.

Figure 1:
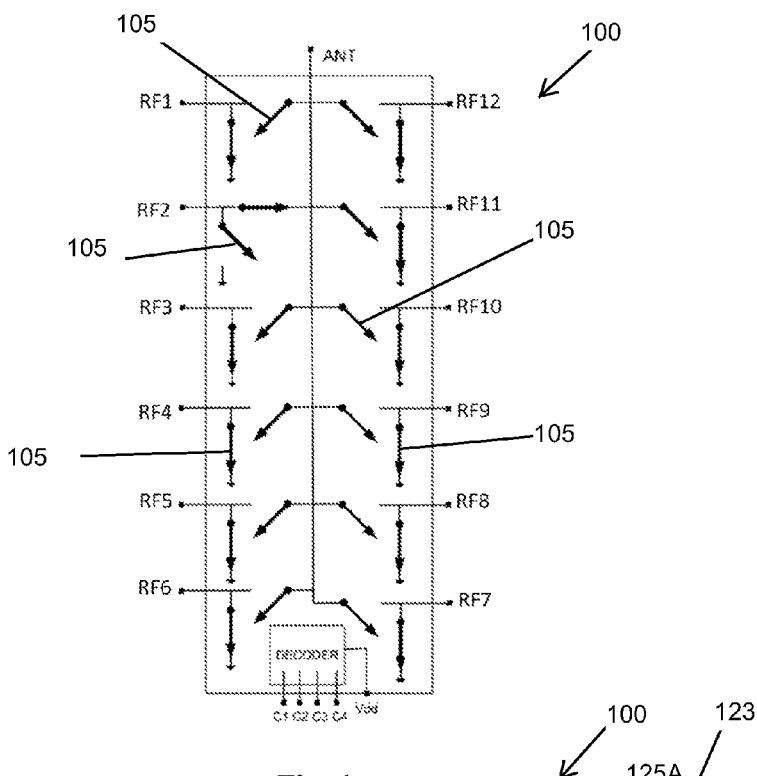
FIG. 1 is a circuit diagram of an exemplary RF switch.
Figure 2:
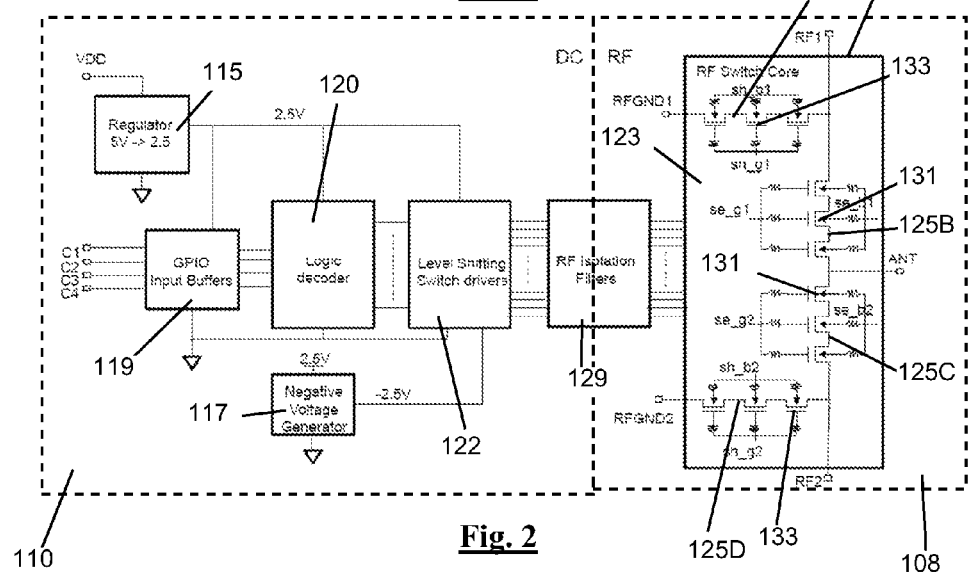
FIG. 2 is a block diagram of an exemplary RF switch.

In advance of describing a radio frequency (RF) switch in accordance with the present teaching an exemplary RF switch 100 is first described with reference to FIGS. 1 to 9. The circuit elements described with reference to the RF switch 100 provide the basic circuit blocks of a traditional RF switch. The RF switch 100 comprises a plurality of switching elements 105 which are operably configured to control the flow of RF power signals between circuit nodes. The RF switch 100 includes two domains; namely, an RF domain section 108 and a direct current (DC) domain section 110 as illustrated in FIG. 2. The DC domain section 110 may comprise one or more digital logic, bias generation, filter, memory, interface, driver and power management circuitry. In the exemplary RF switch 100 the DC domain consists of 5V to 2.5V regulator 115, a negative voltage generator 117, input buffers 119, logic decoder 120 and level-shifting switch drivers 122. These circuits are operably configured to generate the required bias levels, provide power management support and control selection of active switch path through which RF power flows depending on the values set on the control pins C1-C4. Such RF switches are well known in the art.

Figure 3:
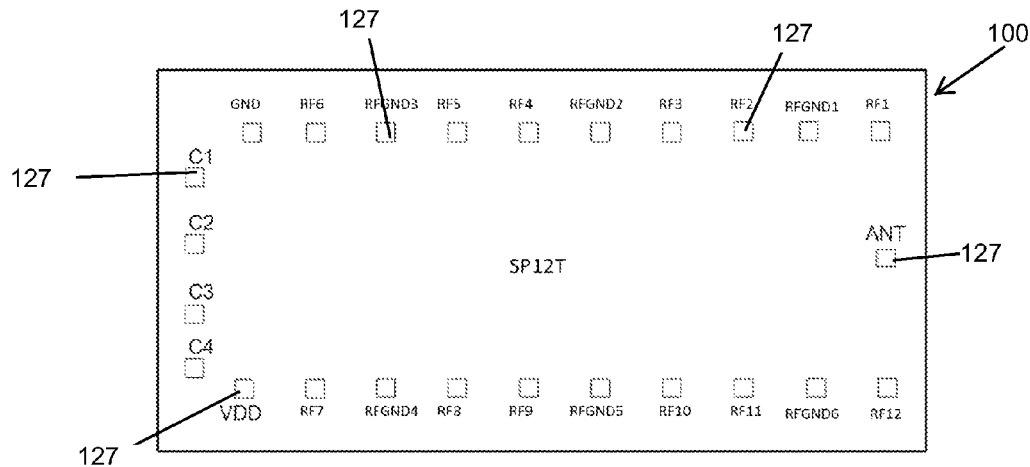
FIG. 3 is pin out diagram of an exemplary RF switch.

The RF domain section 108 comprises a switch core 123 which in the exemplary arrangement includes two series-shunt switch elements 125A-125D. A plurality of transistors 131, 133 are stacked in the switch elements 125A-125D to divide the RF voltage evenly across the transistors so that the voltage between any two terminals of the individual transistors during operation do not exceed a level that may cause performance degradation or damage to the device. RF isolation filters 129 are placed on signal lines controlling the switch gate and body terminals of the transistors 131,133 at the boundary between the RF domain section 108 and the DC domain section 110. In the exemplary arrangement, the RF switch 100 is provided as single-pole, twelve throw (SP12T) RF switch having input/out pins 127 as illustrated in FIG. 3. A description of the pins 127 is detailed in table 1 below.

TABLE 1

| Pin Name | Description |
| --- | --- |
| RF1 | RF Port |
| RFGND1 | RF Ground reference for shunt transistor connecting to RF1 & RF2 Ports |
| RF2 | RF Port |
| RF3 | RF Port |
| RFGND2 | RF Ground reference for shunt transistor connecting to RF3 & RF4 Ports |
| RF4 | RF Port |
| RF5 | RF Port |
| RFGND3 | RF Ground reference for shunt transistor connecting to RF5 & RF6 |
| RF6 | RF Port |
| GND | Ground reference for DC domain |
| C1 | Control input, C1-C4 decoded to select which of RF1-RF12 to ANT paths is active |
| C2 | Control input, C1-C4 decoded to select which of RF1-RF12 to ANT paths is active |
| C3 | Control input, C1-C4 decoded to select which of RF1-RF12 to ANT paths is active |
| C4 | Control input, C1-C4 decoded to select which of RF1-RF12 to ANT paths is active |
| VDD | Supply Voltage for DC domain |
| RF7 | RF Port |
| RFGND4 | RF Ground reference for shunt transistor connecting to RF7 & RF8 |
| RF8 | RF Port |
| RF9 | RF Port |

TABLE 1-continued

| Pin Name | Description |
| --- | --- |
| RFGND5 | RF Ground reference for shunt transistor connecting to RF9 & RF10 |
| RF10 | RF Port |
| RF11 | RF Port |
| RFGND6 | RF Ground reference for shunt transistor connecting to RF11 & RF12 |
| RF12 | RF Port |
| ANT | Antenna Port, RF Common Port |

Figure 4:
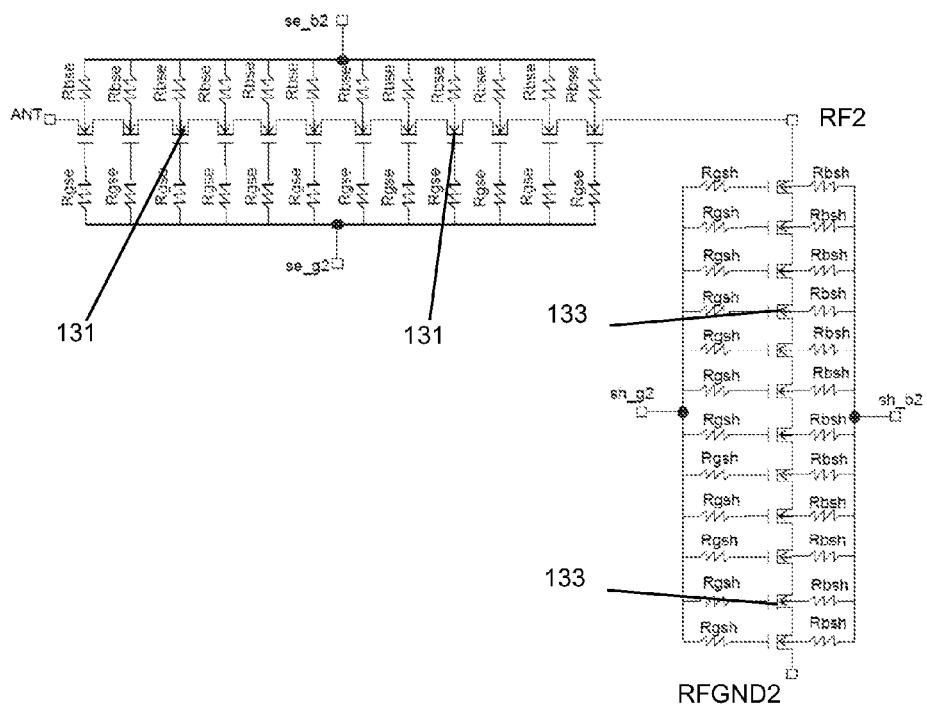
FIG. 4 is a schematic circuit diagram of a detail of the RF switch of FIG. 2.

FIG. 4 shows more detail of the switch core 123 of FIG. 2. The switch core 123 includes a plurality of series transistor elements 131 and a plurality of shunt transistor elements 133. The series transistor elements 131 are in a stacked configuration operably coupled between the antenna node ANT and the RF2 node. The shunt transistor elements 133 are in a stacked configuration operably coupled between the RF2 node and RFGND2 node. The number of transistors in a stack is determined by the maximum RF voltage level that can be experienced on the RF nodes when the switch is operational. A stack of 10-13 transistor devices is common for maximum RF voltages that can be experienced at GSM transmit power levels.

Figure 5:
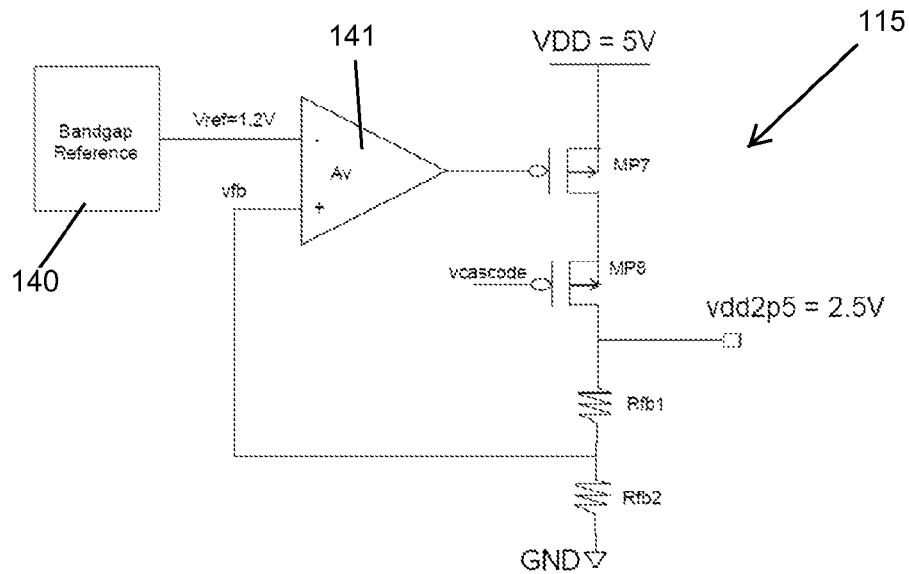
FIG. 5 is a schematic circuit diagram of a detail of the RF switch of FIG. 2.

The voltage regulator 115 of the switch 100 is illustrated in more detail in FIG. 5. The voltage regulator 115 comprises a bandgap reference 140 operably coupled to an input terminal of an op-amp 141. A pair of mosfet transistors MP7, MP8 and a pair of resistors Rfb1, Rfb2 are stacked between a VDD node and a ground reference node. The output from the op-amp 141 drives the MP7 transistor. The gate of the MP8 transistor is operably coupled to a reference voltage source vcascode. A feedback loop is provided from a node intermediate Rfb1 and Rfb2 and an input terminal to the op-amp 141. The voltage regulator 115 is configured to provide a regulated voltage level at a node Vdd2$p$5. In the exemplary arrange the voltage at the node vdd2$p$5 is +2.5V.

Figure 6:
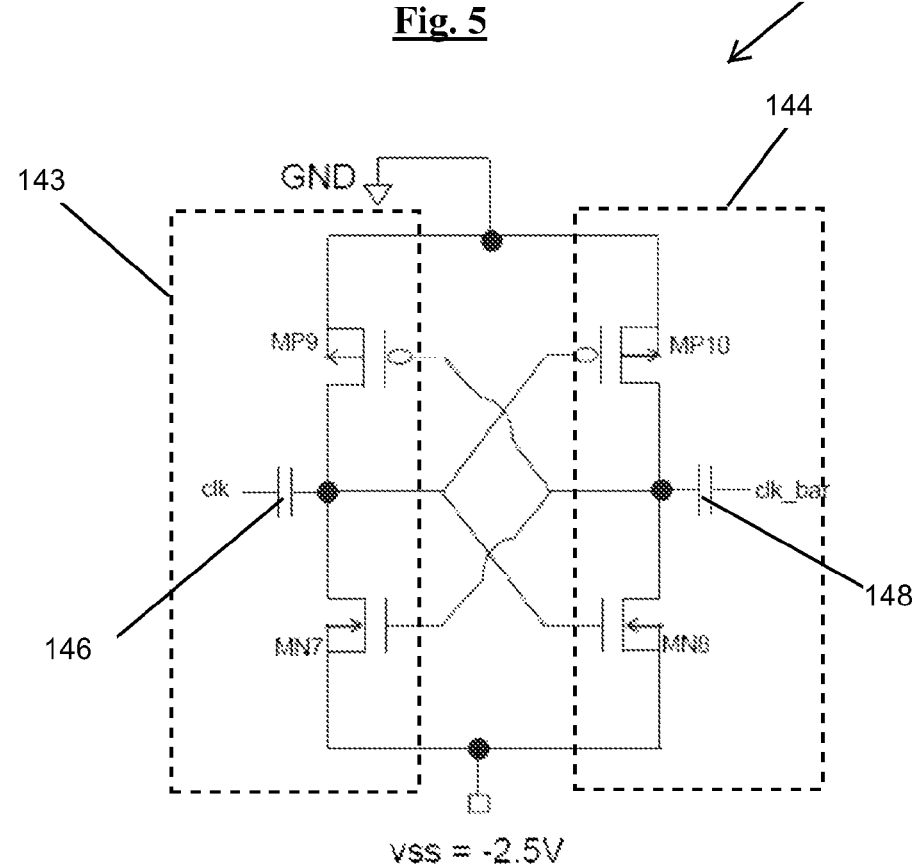
FIG. 6 is a schematic circuit diagram of a detail of the RF switch of FIG. 2.

The negative voltage generator 117 of the switch 100 is illustrated in more detail in FIG. 6. The negative voltage generator 117 comprises a first segment 143 and a second segment 144. The first and second segments 143, 144 are operably coupled between a ground reference node GND and a vss node. The first segment 143 comprises a PMOS transistor MP9 stacked on an NMOS transistor MN7. A first capacitor 146 which receives a clock signal clk is coupled intermediate MP9 and MN7. The second segment 144 comprises a PMOS transistor MP10 stacked on an NMOS transistor MN8. A second capacitor 148 which receives an inverse clock signal clk_bar is coupled intermediate MP10 and MN8. The gates of MP9 and MN7 are driven by the inverse clock signal clk_bar. The gates of MP10 and MN8 are driven by the clock signal clk. The negative voltage generator 117 is configured to provide a negative voltage at the node vss. In the exemplary arrangement the negative voltage which is provided at node vss is 2.5V.

Figure 7:
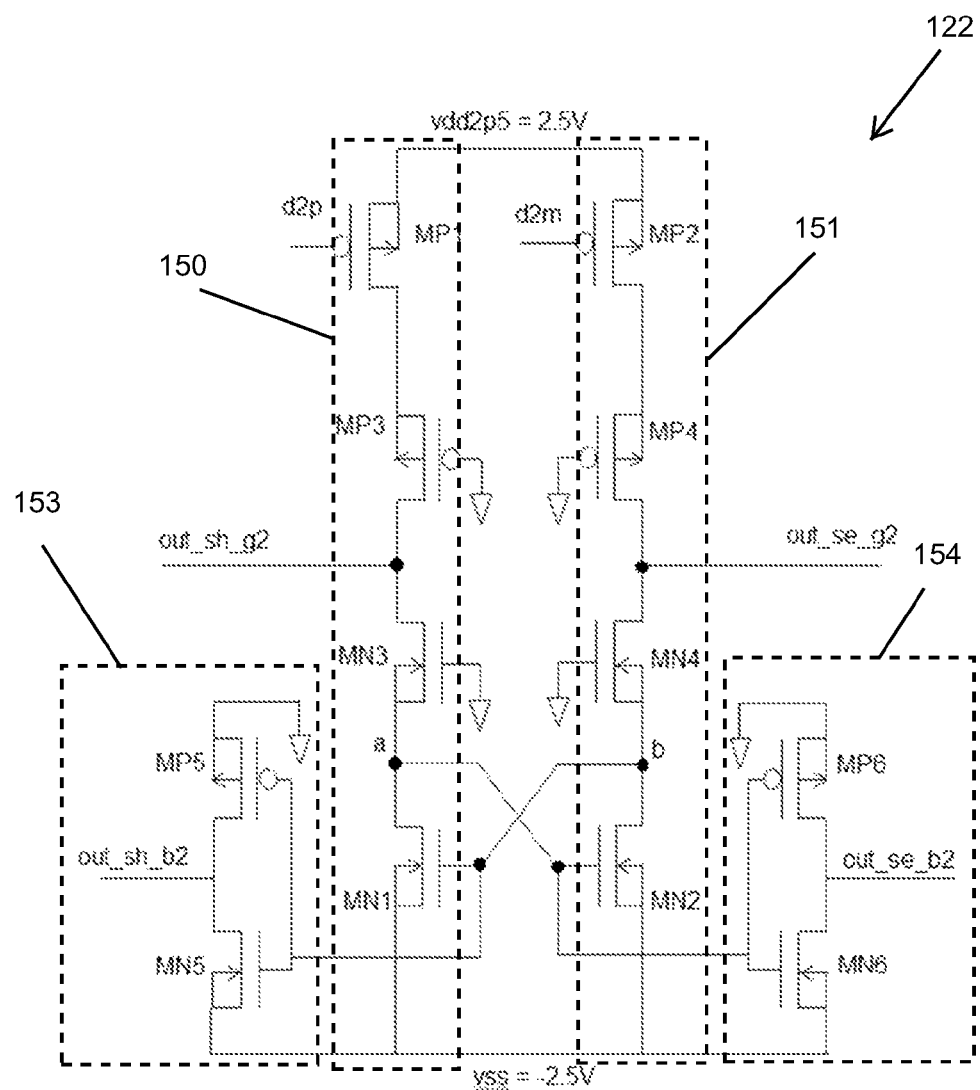
FIG. 7 is a schematic circuit diagram of a detail of the RF switch of FIG. 2.

The level shifting switch driver 122 of the switch 100 is illustrated in more detail in FIG. 7. The switch driver 122 comprises a first switch segment 150 and a second switch segment 151, which are operably coupled between the vdd2$p$5 node of the 5V-2.5V regulator 115 and the negative voltage node vss of the negative voltage generator 117. In the exemplary arrangement, the first switch segment 150 comprises a pair of PMOS transistors MP1 and MP3 and a pair of NMOS transistors MN3 and MN1. The second switch segment 151 comprises a pair of PMOS transistors MP2 and MP4 and a pair of NMOS transistors MN4 and MN2. The first switch segment 150 is associated with a first CMOS inverter 153 that includes a PMOS transistor MP5 and an NMOS transistor MN5 operably coupled between the vss node and a ground node. The second switch segment 151 is associated with a second CMOS inverter 154 that includes a PMOS transistor MP6 and an NMOS transistor MN6 operably coupled between the vss node and a ground node. The level shifting switch driver 122 is configured to provide four output drive signals which are outputted at nodes out_sh_g2, out_sh_b2, out_ se_g2 and out_se_b2. These drive signals are then filtered by the RF isolation filters 129 and the filtered versions of the signals are used to drive the series-shunt switch elements 125A-125D in the switch core 123 of the RF section 108.

Figure 8:
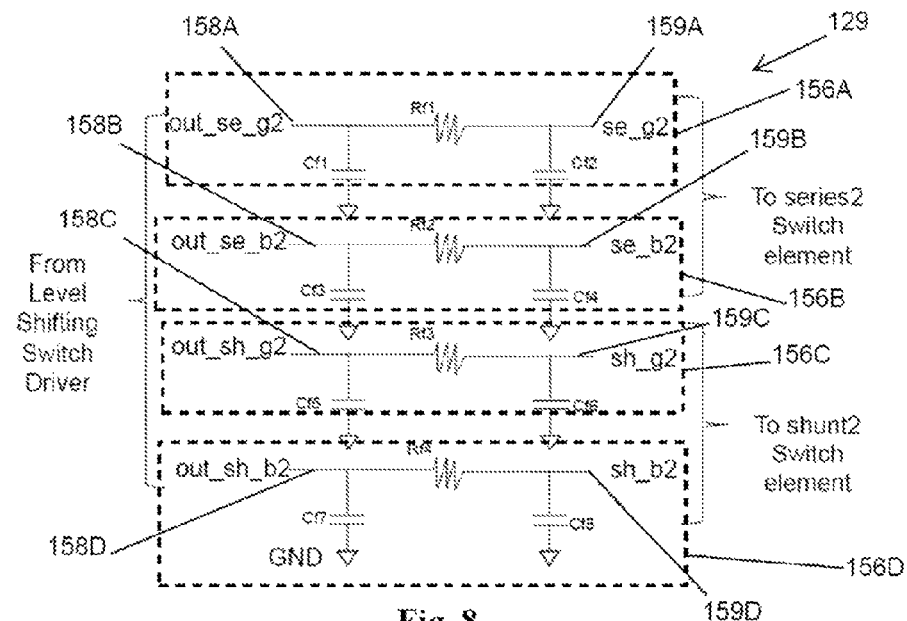
FIG. 8 is a schematic circuit diagram of a detail of the RF switch of FIG. 2.

The RF isolation filters 129 of the switch 100 are illustrated in more detail in FIG. 8. The RF isolation filters 129 are provided in an interface section operably between the DC domain section 110 and the RF domain section 108. In the exemplary arrangement, four filter segments 156A-156D are provided. For brevity, only the filter segment 156A is described. However, it will be appreciated by those of ordinary skill in the art that each of the filter segments 156B to 156D operates in a similar fashion to the filter segment 156A. The filter segment 156A includes a pair of capacitors Cf1 and Cf2 with a resistor Rf1 operably coupled there between. An input node 158A and an output node 159A are provided at respective opposite ends of the resistor Rf1. The capacitors Cf1 and Cf2 each have a first terminal coupled to a ground node. The second terminal of the capacitor Cf1 is coupled to the input node 158A, and the second terminal of the capacitor Cf2 is coupled the output node 159A. The input node 158A receives a drive signal from the node out_se_g2 of the level shifting switch drivers 122 and the output node 159 provides a filtered signal from the node se_g2 which drives the gate terminals of the series switch element 125C in the RF switch core 123 of FIG. 2. Thus the signal from node se_g2 is a filtered representation of the signal from node out_se_g2. In the exemplary arrangement, the filter segment 156B outputs a filtered signal from the node se_b2 which is derived from the signal from node out_se_b2. The filtered signal from the node se_b2 is used to drive the body terminals of the series switch element 125C in the RF switch core 123. The filter segment 156C outputs a filtered signal from node sh_g2 that is derived from the signal of node out_sh_g2. The filtered signal from the node sh_g2 drives the gate terminals of the shunt switch element 125D in the RF switch core 123. The filter segment 156D outputs a filtered signal from the node sh_b2 which is derived from the signal of node out_sh_b2. The filtered signal from the node sh_b2 drives the body terminals of the shunt switch element 125D in the RF switch core 123.

Figure 9:
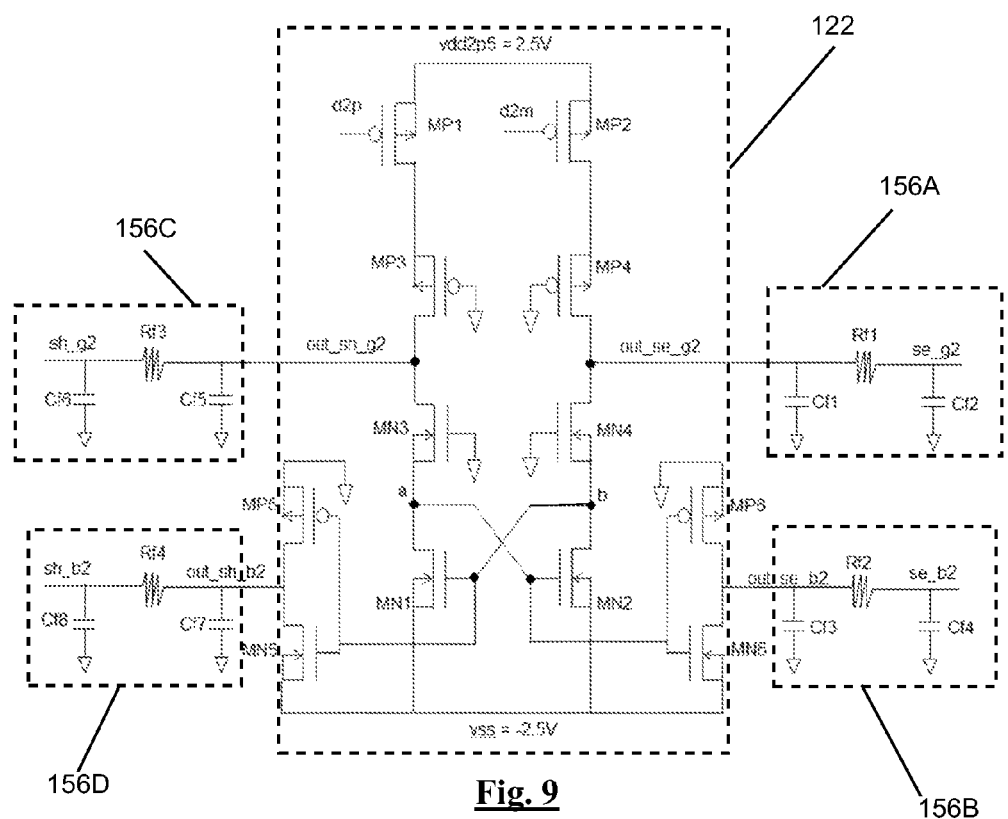
FIG. 9 is a schematic circuit diagram of a detail of the RF switch of FIG. 2.
Figure 10:
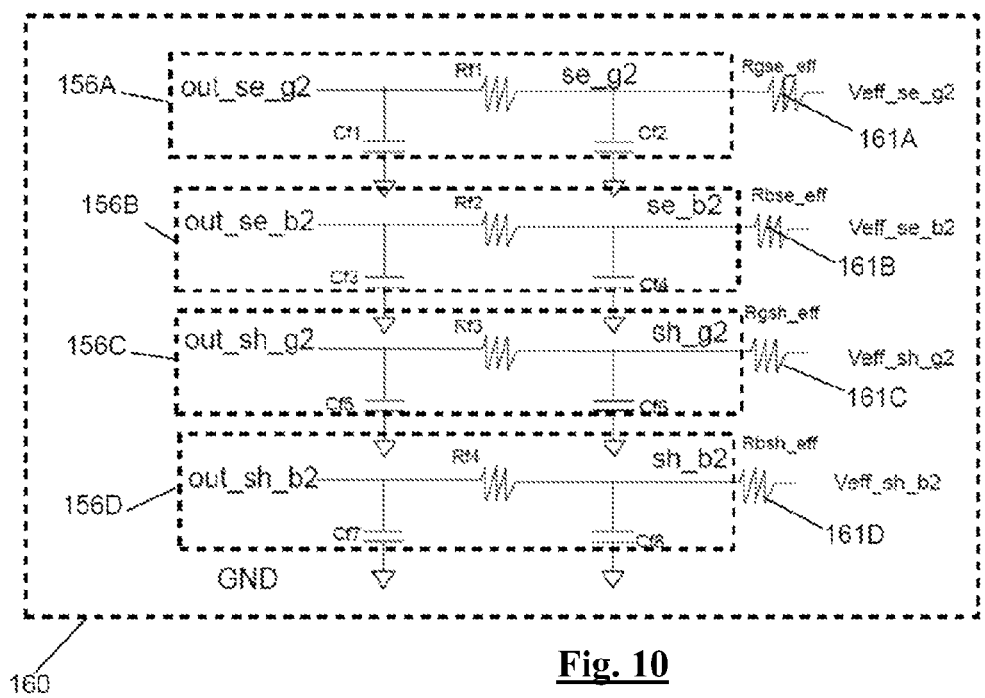
FIG. 10 is an equivalent circuit of the RF isolation filters of FIG. 8.

FIG. 9 illustrates the RF isolation filters 156A-156D operably coupled to the output nodes of the level shifting switch drivers 122. The schematic of FIG. 9 combines the circuit diagrams of FIGS. 7 and 8. An equivalent circuit 160 of the interface between the DC domain section 110 and the RF domain section 108 is illustrated in FIG. 10. The circuit 160 is substantially similar to the circuit of FIG. 8 and like components are indicated by similar reference numerals. An additional resistor element 161 is provided on each filter segment 156 which represents the effective resistance connecting to the gate and body terminals of the transistor elements 131, 133 in the RF switch core 123 of FIG. 2.

Figure 11:
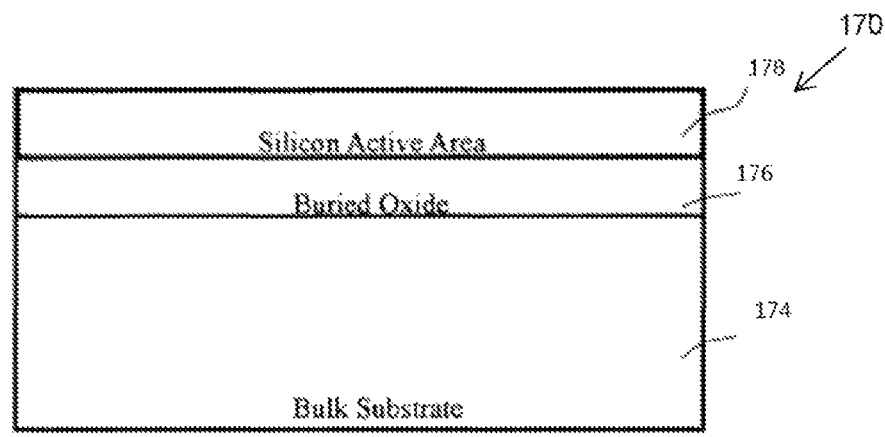
FIG. 11 is a cross sectional side view of a silicon-on-insulator structure on which the RF switch of FIG. 2 may be fabricated thereon.

Referring now to FIG. 11 which illustrates a typical silicon-on-insulator (SOI) structure 170 on which the RF switch 100 may be fabricated thereon. In the exemplary arrangement, an insulating layer sits on top of a silicon substrate. A typical material for the insulating layer is silicon dioxide. In general SOI technologies consist of a bulk substrate 174, a buried oxide layer 176 and a thin active silicon layer 178. The bulk substrate 174 is generally a high resistivity substrate. The bulk substrate 174 can be either P-type or N-Type. A typical thickness for the bulk substrate is 250 μm. The buried oxide layer 176 is an insulator layer, typically silicon dioxide. A typical thickness of the buried oxide layer 176 is 1 μm. The active silicon layer 178 above the buried oxide layer 176 is typically of the order of 0.2 μm. The RF switch 100 may be fabricated in the silicon active area 178 using semiconductor processing techniques that are well known in the art and may include for example, but not limited to, deposition, implantation, diffusion, patterning, doping, and etching. The RF domain section 108 and the DC domain section 110 of the RF switch 100 are typically fabricated on a single semiconductor structure.

Harmonic Distortion arises due to non-linear impedances within a stacked transistor arrangement. Impedance of non-linear element is a function of the voltage difference across the element. The resulting current can be expressed as a power series of the form:

$$i = a_0 + a_1 \cdot v + a_2 \cdot v^2 + a_3 \cdot v^3 + \ldots \qquad \text{Equation 1}$$

Where:

i is current flowing through non-linear impedance, v is voltage difference across non-linear impedance element, and $a_n = \{a_0, a_1, a_2, a_3, \ldots\}$ are $n^{th}$ order conductance coefficients.

In general for RF systems $2^{nd}$ and $3^{rd}$ order distortion is of most concern but power series of Equation 1 can be continued to higher orders of n.

For the case where voltage difference, v, is a single tone of amplitude k, at frequency f, i.e.

$$v = k \cdot \cos(2\pi f t) \qquad \text{Equation 2}$$

The $a_n$ terms result in $n^{th}$ harmonic components in output current at multiples of n-times the fundamental frequency.

Existing art approaches target approximately symmetrical division of RF voltage on gate and body with respect to drain and source to increase compression point that can be achieved when transistors are stacked. The following section identifies fundamental sources of asymmetry in transistors stack and existing circuit topologies and discloses circuit and physical design approaches to eliminate them. The result is an improved linearity performance of the RF transistor stack.

Figure 12:
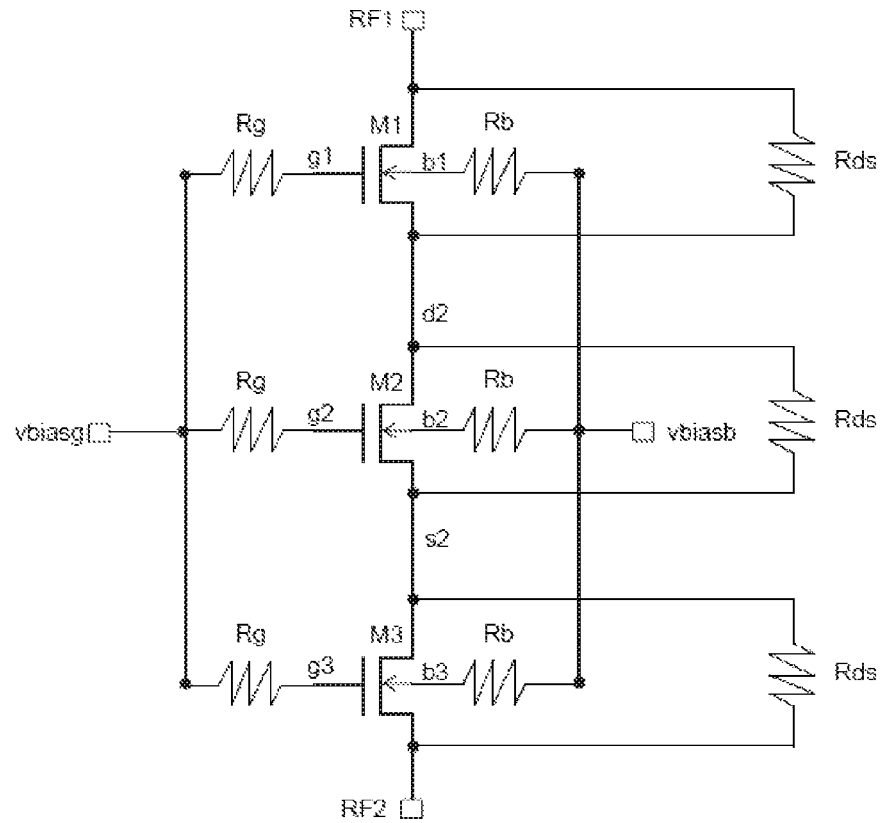
FIG. 12 is a schematic circuit diagram of a transistor stack in accordance with the present teaching.

FIG. 12 shows a state of the art RF transistor stack arrangement. A stack of three body-contacted transistors is shown for illustration but the number of transistors stacked will depend on maximum RF voltage that can be developed between RF1 and RF2 as will be appreciated by those ordinary skilled in the art. The gate terminal of each transistor is connected to a common bias point, vbiasg, through resistor, Rg. The body terminal of each transistor is connected to a common bias point, vbiasb, through resistor, Rb. In prior art arrangements the values of gate and body resistors are chosen such that the RC time constant formed by coupling capacitances from drain and source to gate and body is larger than an inverse of the operating RF frequency so that the RF voltage is divided approximately equally across each of the transistors in the stack to increase the compression point of the structure.

RF1 and RF2 are ports where an RF signal is input or output. The RF signal at a port is around the DC bias point of 0V. When the transistor stack is in an on-state the common gate bias point, vbiasg, is set to a positive value in excess of the threshold voltage, e.g. vbiasg=2.5V. In the on-state the common body bias, vbiasb, point is set to be equal to the drain and source DC bias value of 0V.

When the transistor stack is in an off-state the common gate bias point, vbiasg, and the common body bias point, vbiasb, are set to a negative value to ensure the transistors remain off in the presence of the RF voltage, e.g. vbiasg=−2.5V, vbiasb=−2.5V.

High resistance drain to source bias resistors, Rds, are included to provide the DC bias of 0V to drain and source terminals of transistors in the stack when the transistors are in an off-state.

Figure 13A:
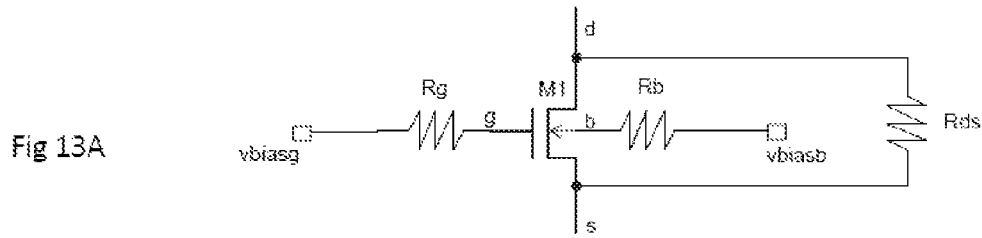
FIG. 13A is a schematic circuit diagram of a detail of the transistor stack of FIG. 12.

FIG. 13A shows a circuit arrangement for one of the elements in the stack. Transistor, M1, has drain terminal, d, and source terminal, s. The gate terminal of M1, g, is connected to the common bias point, vbiasg, through resistor, Rg. The body terminal of M1, b, is connected to the common bias point, vbiasb, through resistor, Rb. High resistance drain to source bias resistors, Rds, are included to provide a DC bias of 0V to the drain and source terminals when the transistor is in off-state.

Figure 13B:
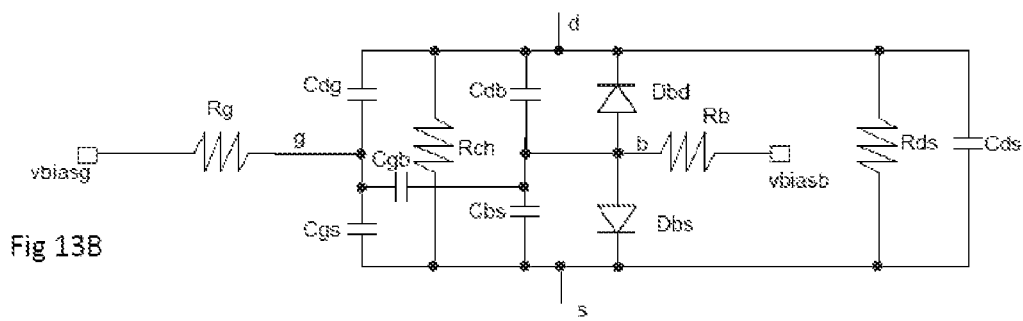
FIG. 13B is a schematic circuit diagram of a detail of the transistor stack of FIG. 12.

FIG. 13B shows a simplified model for one of the transistors in the stack. In literature different models are often shown for transistors depending on whether it is biased in an on-state or an off-state. A single model for both states is shown here that illustrates asymmetry sources.

Transistor M1 is replaced by a simplified model for channel resistance, Rch, and parasitic elements. In the on-state the channel resistance is low and is the main contributor to impedance between the drain and source. In the off-state the channel resistance is high, ideally infinite, and the parasitic elements are the main contributors to the impedance between the drain and source.

Parasitic elements related to the gate terminal consist of capacitance between the drain and gate, Cdg, and capacitance between the gate and source, Cgs. These capacitances are due both to inherent device capacitance and interconnect capacitance due to routing on physical layout.

Parasitic elements related to the body terminal consist of capacitance between drain and body, Cdg, and capacitance between the body and source, Cbs. These capacitances are due both to inherent device capacitance and interconnect capacitance due to routing on physical layout. Parasitic diodes between the body and drain, Dbd, and body and source, Dbs, contribute to inherent device capacitance.

Parasitic capacitance between drain and source, Cds, is also included. This parasitic is made up of inherent device capacitance and interconnect capacitance due to routing on the physical layout. This parasitic does not contribute to the asymmetry of inter-terminal voltage on the single transistor element but can contribute to unequal division of the RF signal through stacked arrangement.

Parasitic capacitance between gate and body, Cgb, is also included. This parasitic is made up of the inherent device capacitance and interconnect capacitance due to routing on the physical layout. This parasitic capacitance can cause asymmetry on capacitances between the drain and gate and capacitances between the gate and source to influence asymmetry in division of RF voltage from drain to body and body to source, particularly when transistor is in off state.

Imbalance in impedance from drain to gate, Zdg, and gate to source, Zgs, results in unequal division of the RF drain to source voltage, vds, between the drain to gate, vdg, and gate to source, vgs.

Imbalance in impedance from drain to body, Zdb, and body to source, Zbs, results in an unequal division of the RF drain to source voltage, vds, between drain to body, vdb, and body to source, vbs.

The dominant source of imbalance in impedances to the body terminal are diodes Dbd and Dbs. Arrangement of the diodes are asymmetrical because Zdb contains diode oriented N—P and Zbs contains diode oriented P—N. The transistor is fundamentally asymmetrical. There is much less imbalance in impedances to the gate terminal because capacitance is largely made up of oxide capacitance.

Figure 14:
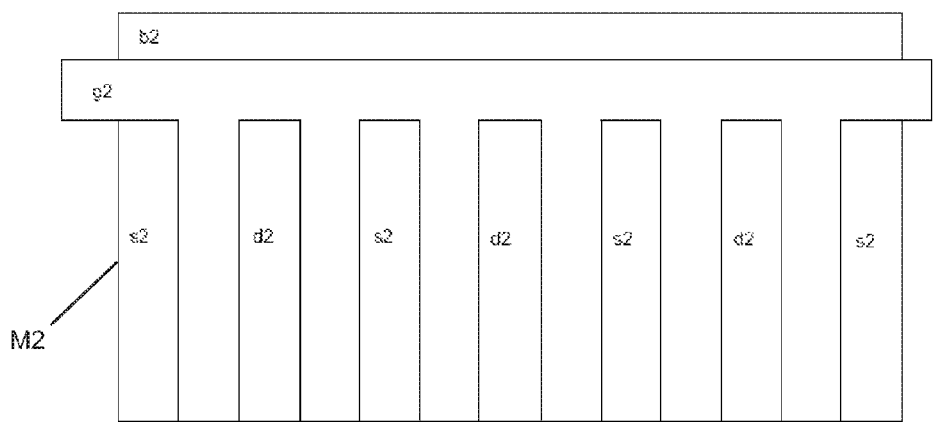
FIG. 14 is a diagrammatic representation of a transistor with a T-gate layout configuration.

FIG. 14 illustrates a physical layout of the transistor M2 in the RF transistor stack. Transistor M2 has a multi-finger body contacted NMOS with a T-gate layout configuration. The poly silicon gate, connected to g2, is isolated from a lightly doped p-type region underneath by an oxide layer. This lightly doped p-type region forms the transistor body. The heavily doped p-type body contact region, connected to b2, is in contact with the lightly doped p-type body region under the gate oxide. The drain and source regions, connected to d2 and s2 respectively, consist of heavily doped n-type diffusion. When the transistor is turned on by applying a positive voltage in excess of the transistor threshold voltage on the gate a channel is formed under the gate oxide providing a conductive path between the drain and source regions.

Figure 15:
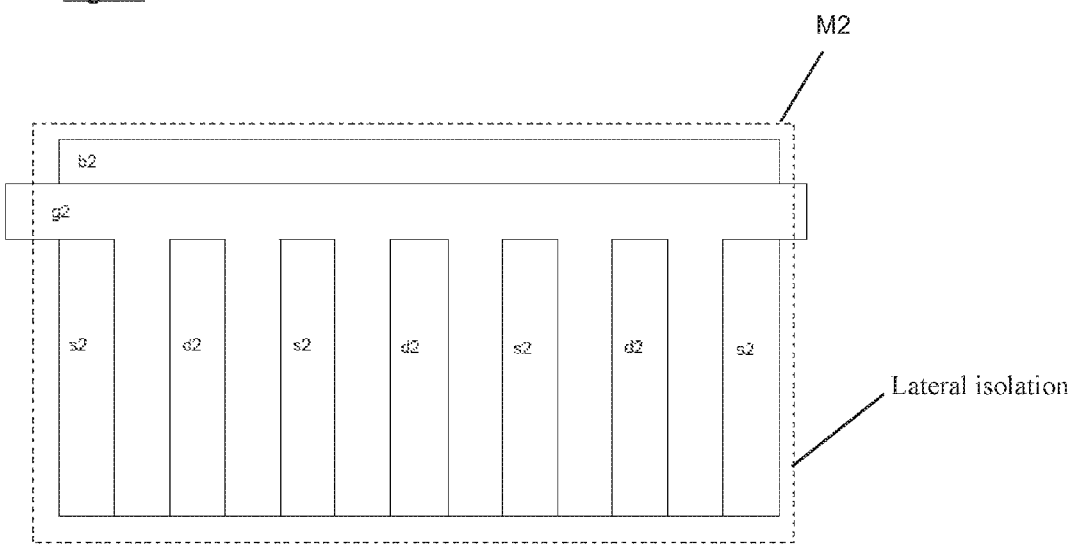
FIG. 15 is a diagrammatic representation of a transistor with a T-gate layout configuration having lateral isolation.

FIG. 15 illustrates a physical layout of the transistor M2 shown in FIG. 14 with an additional lateral isolation region surrounding the device.

Figure 16:
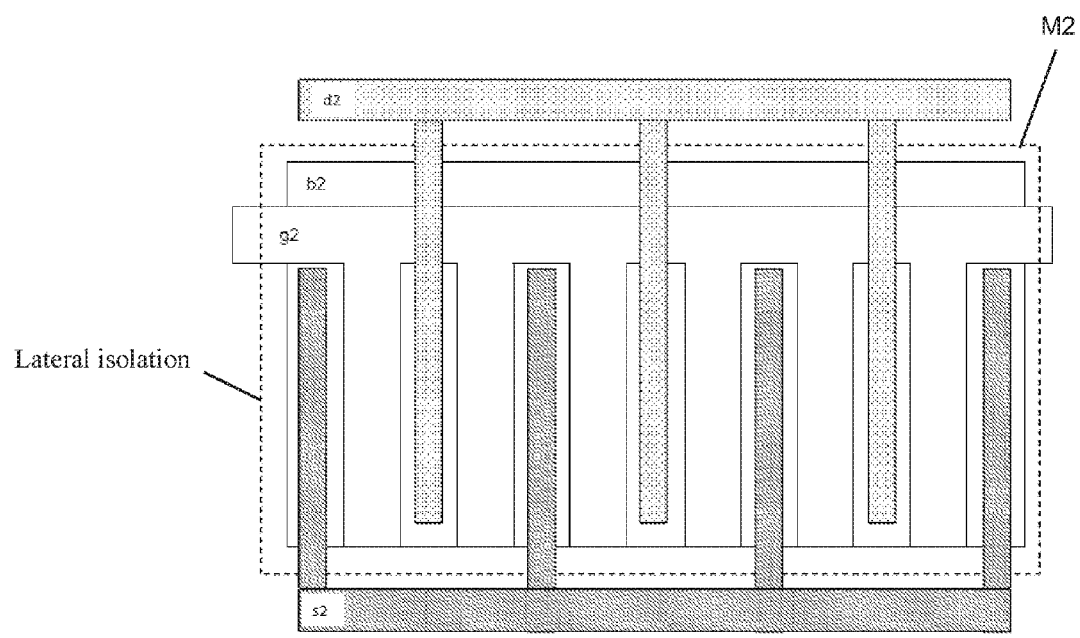
FIG. 16 is a diagrammatic representation of a transistor with a T-gate layout configuration having lateral isolation and drain and source interconnects.

FIG. 16 illustrates a physical layout of the transistor M2 shown in FIG. 15 with an interconnect included to connect the separate source diffusion regions as a single node, s2, and to connect the separate drain diffusion regions as a single node, d2. This interconnect includes contact between each of individual drain diffusion region and metal to connect individual drain diffusion regions as a single node, d2, and contact between each of individual source diffusion region and metal to connect individual source diffusion regions as a single node, s2.

Figure 17:
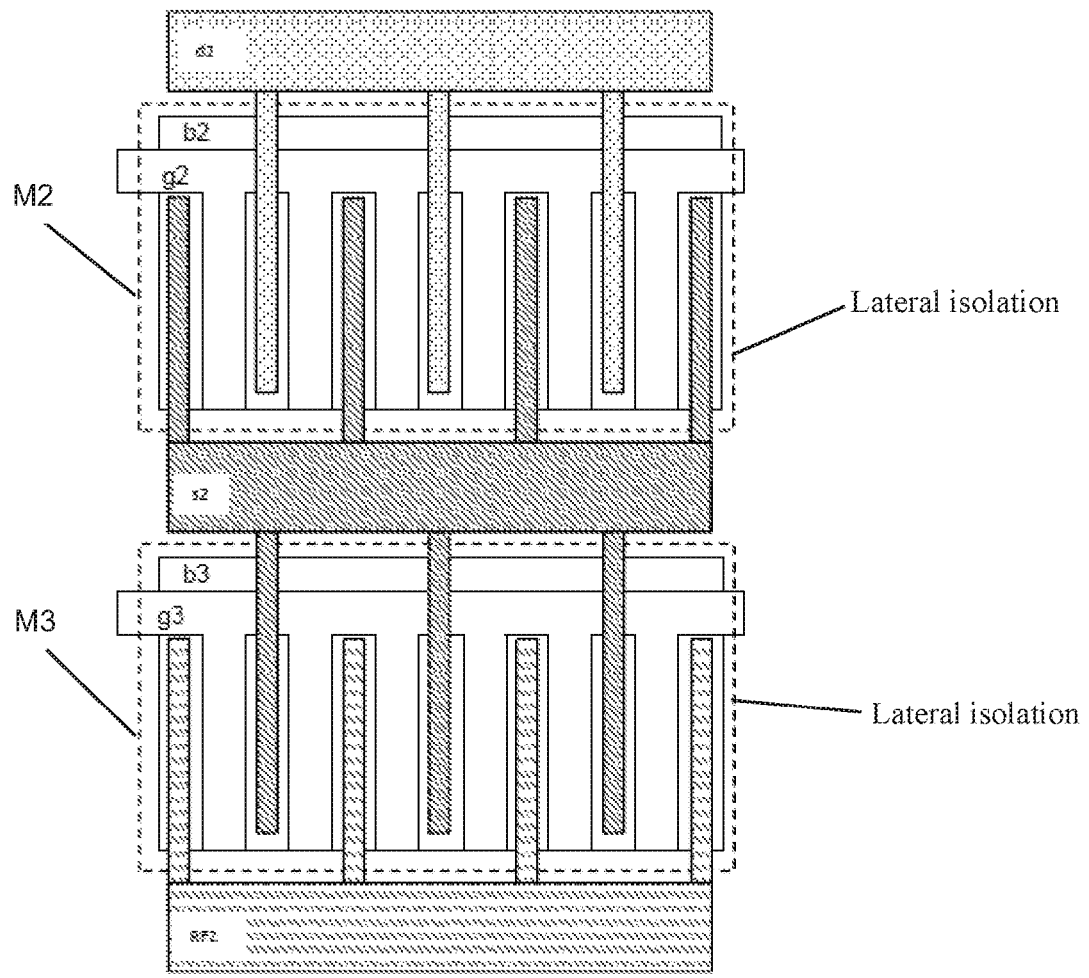
FIG. 17 is a diagrammatic representation of an RF transistor stack comprising two transistors having a T-gate layout configuration.

FIG. 17 illustrates a physical layout of a stack of two transistors M2 and M3 with interconnect to connect the separate source diffusion regions within each transistor as a single node and to connect the separate drain diffusion regions within each transistor as a single node. The interconnect between transistors in stack is also shown where s2 node is connected to source of M2 and drain of M3. The interconnect between transistors is orthogonal to the conductive layers providing gate and body bias to the transistors within the stack. The interconnect between transistors crosses the conductive layers providing gate and body bias to the transistors at one end of T-gate transistor structure. In this case the interconnect crosses the gate and body bias at the same end of the transistor for devices M2 and M3.

Figure 18:
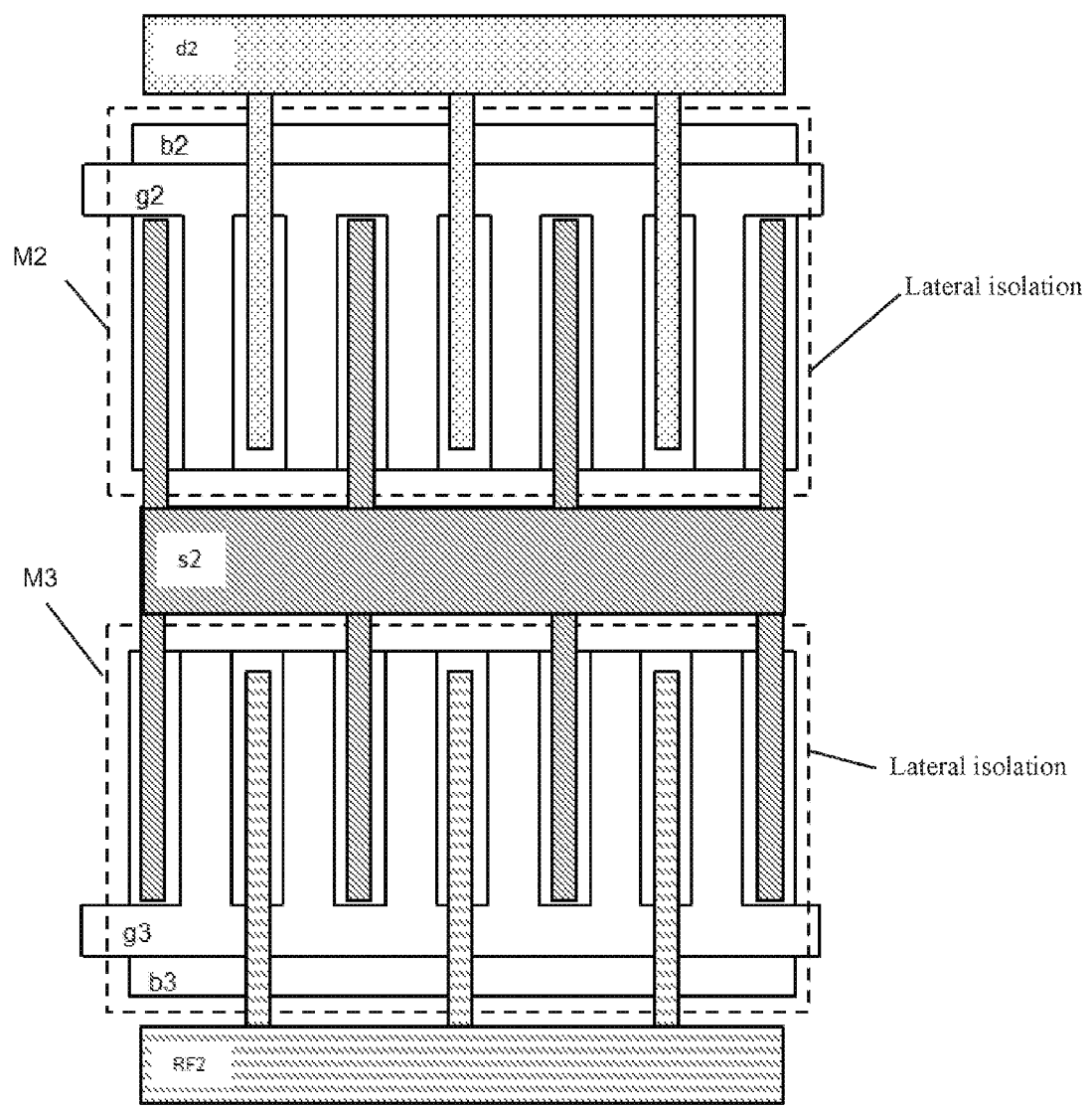
FIG. 18 is a diagrammatic representation of an RF transistor stack comprising two transistors having a T-gate layout configuration in accordance with the present teaching.

FIG. 18 illustrates an enhancement to FIG. 17 where the non-linearity of the stack of transistors due to layout parasitics is reduced. FIG. 18 shows a physical layout of a stack of two transistors M2 and M3 with an interconnect to connect the separate source diffusion regions within each transistor as a single node and to connect the separate drain diffusion regions within each transistor as a single node. The interconnect between transistors in the stack is also shown where s2 node is connected to the source of M2 and the drain of M3. The interconnect between transistors is orthogonal to conductive layers providing gate and body bias to the transistors within the stack. The interconnect between the stacked transistors M2, M3 does not cross the conductive layers providing the gate and body bias to the transistors. In this case the interconnect crosses the gate and body bias at the opposite end of the transistor for devices M2 and M3.

In the off-state the dominant source of imbalance in impedances to the body terminal are the diodes Dbd and Dbs. The arrangement of the diodes is asymmetrical because Zdb contains diode oriented N—P and Zbs contains diode oriented P—N. However compared to the on-state there is less imbalance in capacitance due to the body diodes because reverse bias on diodes in this state is −2.5V. There is much less imbalance in impedances to the gate terminal because capacitance is largely made up of oxide capacitance.

Figure 19A:
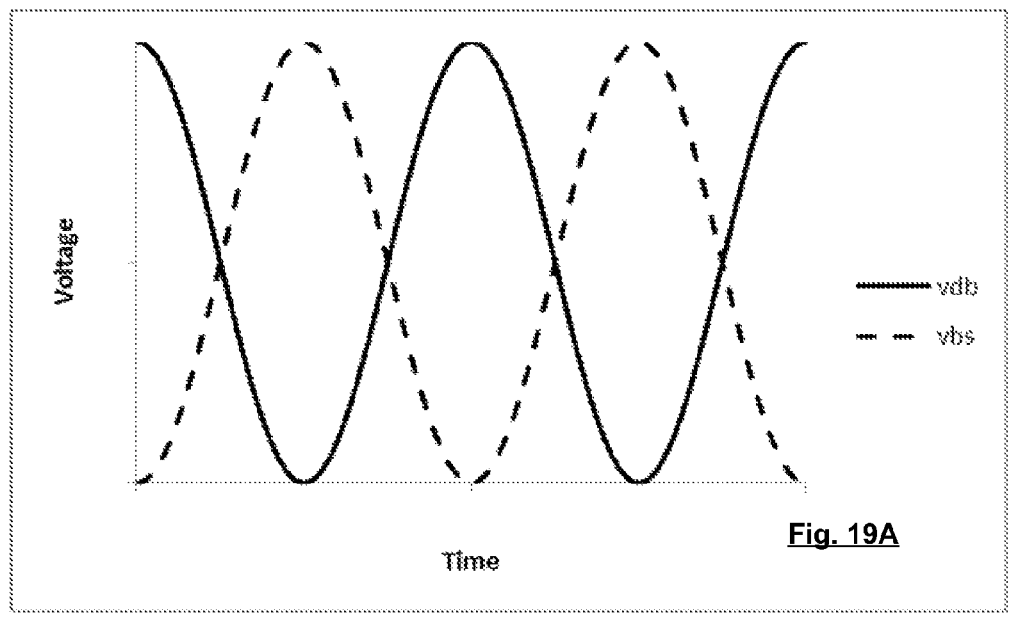
FIG. 19A shows the RF voltage across the drain to body, vdb, and across the body to source, vbs, of a transistor in the stack for an ideal case if there was uniform division of the RF voltage with respect to the body.

FIG. 19A shows the RF voltage across the drain to body, vdb, and across the body to source, vbs, of a transistor in the stack for an ideal case if there was uniform division of the RF voltage with respect to the body. In this case at any point in time the drain to body voltage is equal in amplitude to the body to source voltage and the drain to body voltage is 180° out of phase with the body to source voltage, i.e.

$$v_{db} = -1 \times v_{bs} \quad \text{Equation 3}$$

Where:
$v_{db}$ is drain to body voltage; and
$v_{bs}$ is body to source voltage.

It follows that the voltage from N to P region on both the drain to body and source to body diodes are equal in this ideal case.

$$v_{db} = v_{sb} \quad \text{Equation 3(a)}$$

Where:
$v_{db}$ is drain to body voltage; and
$v_{sb}$ is source to body voltage.

The non-linearity in impedances Zdb and Zbs result in non-linear current components as described by Equation (1). The distortion current components in the drain to body diode are $$i_{db} = a_0 + a_1 \cdot v_{db} + a_2 \cdot v_{db}^2 + a_3 \cdot v_{db}^3 + \ldots \quad \text{Equation 4}$$

Where:
$i_{db}$ is drain to body distortion current,
$v_{db}$ is drain to body voltage and
$a_n = \{a_0, a_1, a_2, a_3, \ldots\}$ are $n^{th}$ order conductance coefficients.

The distortion current components in the source to body diode are $$i_{sb} = a_0 + a_1 \cdot v_{sb} + a_2 \cdot v_{sb}^2 + a_3 \cdot v_{sb}^3 + \ldots \quad \text{Equation 5}$$

Where:
$i_{sb}$ is source to body distortion current,
$v_{sb}$ is source to body voltage and
and $a_n = \{a_0, a_1, a_2, a_3, \ldots\}$ are $n^{th}$ order conductance coefficients.

For the case where there is uniform division of RF voltage with respect to the body the $n^{th}$ order distortion current components are in the drain to body diode and body to drain diode are of equal magnitude.

The orientation of the P—N junctions in the drain to body diode is the reverse of that in the source to body-diode, the total distortion current that flows from drain to source as a result of these diodes is the difference between the drain to body and source to body distortion currents, i.e.

$$i_{ds\_body} = i_{db} - i_{sb} \quad \text{Equation 6}$$

Where:
$i_{ds\_body}$ is distortion current flowing from drain to source due to body diodes,
$i_{db}$ is drain to body distortion current; and
$i_{sb}$ is source to body distortion current.

For the case where there is uniform division of the RF voltage with respect to the body the $n^{th}$ order distortion current components are in the drain to body diode and body to drain diode are of equal magnitude. In this ideal case there is cancellation of the distortion current components in the drain to body diode and source to body diode so that the net distortion current flowing from drain to source due to body distortion is zero.

Figure 19B:
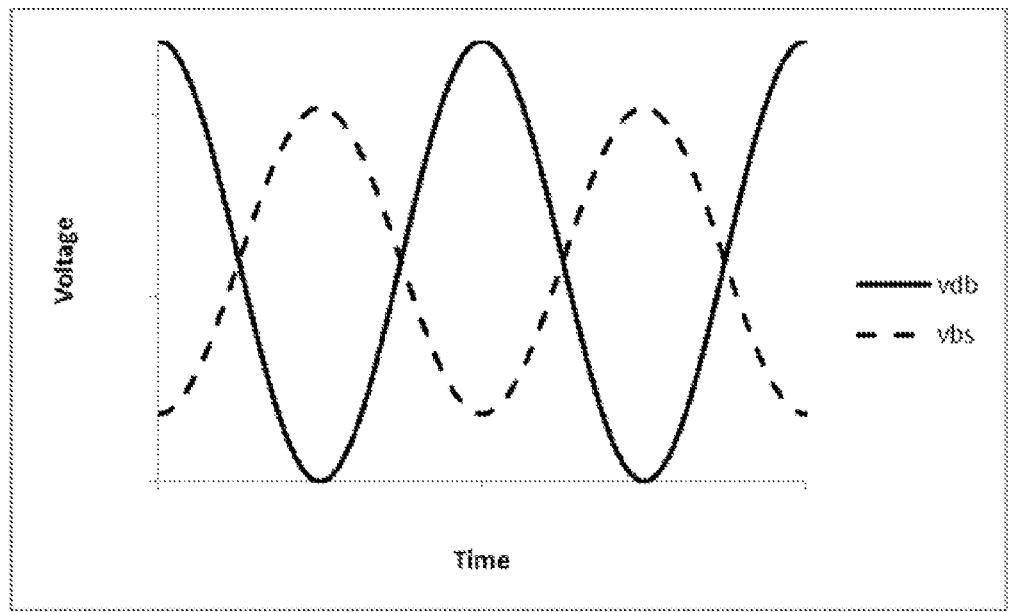
FIG. 19B shows the RF voltage across the drain to body, vdb, and across the body to source, vbs, of a transistor in the stack for a non-ideal case when there is non-uniform division of the RF voltage with respect to the body.

In reality there is non-uniform division of the RF voltage with respect to the body as shown in FIG. 19B. This is due both to the difference in orientation of the P—N junctions on the drain to body and the source to body junction and also the differences in parasitic layout capacitances that make up Cdb, Cbs, Cdg and Cgs shown in FIG. 13B. There is unavoidable asymmetry between Cdb and Cbs and also between Cdg and Cgs as a result of the interconnect to conduct the RF signal between the transistors in the stack perpendicularly crossing layers providing gate and body bias to each transistor within stack. In this real case the voltage from N to P region on the drain to body and source to body diodes are not equal $$v_{db} = c \times v_{sb} \qquad \text{Equation 7}$$

Where:
$v_{db}$ is drain to body voltage,
$v_{sb}$ is source to body voltage; and
c is a constant, not equal to one.

Combining Equations 4-7 it can be shown that for the case where there is non-uniform division of the RF voltage with respect to the body the $n^{th}$ order distortion current components in the drain to body diode and the body to drain diode are not of equal magnitude. In this real case where there is not cancellation of the distortion current components in the drain to body diode and source to body diode the net distortion current flowing from drain to source due to body distortion is non-zero.

In a stacked transistor arrangement where there is asymmetry in division of RF voltage from drain to body and body to source of each transistor the total distortion current flowing into or out of a port at either end of stack is the sum of distortion currents within each transistor, i.e.

$$i_{tot\_body} = \Sigma_{n=1}^{Nstack} i_{ds\_body(n)} \qquad \text{Equation 8}$$

Where:
$i_{tot\_body}$ is total distortion current flowing into port at end of transistor stack due to body diodes,
$i_{ds\_body(n)}$ is distortion current flowing from drain to source due to body diodes of each transistor in stack,
$N_{stack}$ is number of devices in stack; and
n=1, 2, . . . Nstack, is integer index of transistors in stack.

A transistor stack layout arrangement is shown in FIG. 18 where distortion due to asymmetry within individual transistor stacks is reduced. Distortion due to asymmetry in division of RF voltage between the drain to source and the source to body terminals of one transistor is cancelled by reversing the asymmetry in division of RF voltage in another transistor in stack. The reversal of asymmetry in RF voltage is achieved by reversing the asymmetry of Cdb, Cbs layout parasitic capacitances and by reversing the asymmetry of Cdg, Cgs layout parasitic capacitances. The end of the T-gate transistor structure where the interconnect crosses the horizontal is reversed with respect to the direction of RF signal flow between transistors in stack for the two transistors shown in FIG. 18. With this type of arrangement the lowest distortion due to the body diodes occurs when the number of transistors in stack where interconnect between transistors in stack or between transistor and port crosses body or gate routing within the transistor at the end of transistor from where the RF signal flows is equal to the number of transistors in stack where the interconnect between the transistors in the stack or between transistors and port crosses body or gate routing within the transistor at end of the transistor to which RF signal flows. This can be understood with reference to the exemplary stack of two transistors of FIG. 18 which represents a partial physical layout of the schematic shown in FIG. 12. In the case where the RF signal is applied at port RF1 and flows to port RF2, it can be seen that the direction of signal flow through transistors M2 and M3 is along the axis from d2 to s2 to RF2. In FIG. 18 the interconnect between transistors M1 and M2 crosses body, b2, and gate, g2, routing to M2 at the end of transistor from which the RF signal flows, d2. The interconnect between M3 and the output port RF2 crosses body, b3, and gate, g3, routing to M3 at the end of transistor to which RF signal flows, RF2. This results in distortion due to asymmetry in transistor M2 being cancelled by reversing distortion due to asymmetry in M3. For the case where there are larger number of transistors in stack, e.g. 14, the lowest distortion occurs when orientation of 7 of the transistors is opposite to the remaining 7 transistors so that there is cancellation in asymmetry across each of the 7 pairs of transistors.

Table 2 contains hardware measurements showing the linearity benefits of improved linearity transistor stack layout of FIG. 18. The $2^{nd}$ harmonic power generated by SP10T switch when an 710 MHz RF signal is applied is reported for both standard transistor stack layout arrangement and enhanced linearity transistor stack layout arrangement. In both cases the device dimensions and stack height are equal.

TABLE 2

| Pin | SP10T with Standard Transistor Stack Layout $2^{nd}$ Harmonic Power (dBm) | SP10T with Enhanced Linearity Transistor Stack Layout $2^{nd}$ Harmonic (dBm) |
| --- | --- | --- |
| 25 | −76.6 | −85.4 |
| 26 | −74.8 | −84.3 |
| 27 | −73.1 | −83.1 |
| 28 | −71.5 | −82.1 |

The measurements clearly display the reduced distortion benefits of enhanced linearity transistor stack layout arrangement of FIG. 18. The $2^{nd}$ harmonic power generated by SP10T switch is between 8.8 dB to 10.6 dB lower due to the enhancement.

While the present teaching has been described with reference to exemplary arrangements and circuits it will be understood that it is not intended to limit the teaching of the present teaching to such arrangements as modifications can be made without departing from the spirit and scope of the present invention. In this way it will be understood that the present teaching is to be limited only insofar as is deemed necessary in the light of the appended claims.

Similarly the words comprises/comprising when used in the specification are used to specify the presence of stated features, integers, steps or components but do not preclude the presence or addition of one or more additional features, integers, steps, components or groups thereof.

What we claim is:
1. An RF transistor stack comprising:
   a first transistor having a T-gate layout configuration, the first transistor having a body region a plurality of drain regions and a plurality of source regions;

a second transistor having a T-gate layout configuration the second transistor having a body region, a plurality of drain regions, and a plurality of source regions, wherein the orientation of the second transistor is a mirror orientation of the first transistor; and an interconnect operably coupling the source regions of the first transistor with the drain regions of the second transistor such that the first and second transistors operate in a pair to form a stacked switching element having an on state and an off state, the interconnect not crossing the gate and body regions of the first and second transistors, the stacked switching element being configured to divide an RF voltage across the first and second transistors as result of the mirror orientation of the first and second transistors such that a distortion due to asymmetry in the division of RF voltage between a drain to body and a source to body terminals of the first transistor is cancelled by reversing the asymmetry in the division of the RF voltage in the second transistor when the switching element is in the off state.

2. An RF transistor stack as claimed in claim 1, wherein the first and second transistors are arranged in the stack such that the first and second transistors have a 180° opposite orientation.

3. An RF transistor stack as claimed in claim 1, wherein the interconnect between the first and second transistors is orthogonal to respective conductive layers providing gate and body bias to the first and second transistors.

4. An RF transistor stack as claimed in claim 1, wherein the reversal of asymmetry in the RF voltage is achieved by reversing the asymmetry of the parasitic layout capacitances.

5. An RF transistor stack as claimed in claim 1, wherein the reversal of asymmetry in the RF voltage is achieved by reversing the asymmetry of the parasitic layout capacitances Cdb, Cbs and by reversing the asymmetry of the layout capacitances Cdg, Cgs.

6. An RF transistor stack as claimed in claim 1, wherein the first transistor has an associated lateral isolation.

7. An RF transistor stack as claimed in claim 1, wherein the second transistor has an associated lateral isolation.

8. An RF transistor stack as claimed in claim 1, wherein first transistor and the second transistor are separate transistors which are operably coupled together during fabrication of the stack.

9. An RF transistor as claimed in claim 1, wherein two or more transistors are provided in the stack.

10. A semiconductor substrate having an RF transistor stack fabricated thereon, wherein the RF transistor stack comprises:

a first transistor having a T-gate layout configuration the first transistor having a body region, a plurality of drain regions, and a plurality of source regions;

a second transistor having a T-gate layout configuration, the second transistor having a body region, a plurality of drain regions, and a plurality of source regions, wherein the orientation of the second transistor is a mirror orientation of the first transistor; and an interconnect operably coupling the source regions of the first transistor with the drain regions of the second transistor such that the first and second transistors operate in a pair to form a stacked switching element having an on state and an off state, the interconnect not crossing the gate and body regions of the first and second transistors, the stacked switching element being configured to divide an RF voltage across the first and second transistors as result of the mirror orientation of the first and second transistors such that a distortion due to asymmetry in the division of RF voltage between a drain to body and a source to body terminals of the first transistor is cancelled by reversing the asymmetry in the division of the RF voltage in the second transistor when the switching element is the off state.

11. A method of fabricating an RF transistor stack, the method comprising:

providing a first transistor having a T-gate layout configuration, the first transistor having a body region, a plurality of drain regions, and a plurality of source regions;

providing a second transistor having a T-gate layout configuration the second transistor having a body region, a plurality of drain regions and a plurality of source regions, wherein the orientation of the second transistor is a mirror orientation of the first transistor; and providing an interconnect operably coupling the source regions of the first transistor with the drain regions of the second transistor such that the first and second transistors operate in a pair to form a stacked switching element having an on state and an off state, the interconnect not crossing the gate and body regions of the first and second transistors, the stacked switching element being configured to divide an RF voltage across the first and second transistors as result of the mirror orientation of the first and second transistors such that a distortion due to asymmetry in the division of RF voltage between a drain to body and a source to body terminals of the first transistor is cancelled by reversing the asymmetry in the division of the RF voltage in the second transistor.

* * * * *